United States Patent [19]
Hayashi

[11] Patent Number: 6,088,283
[45] Date of Patent: Jul. 11, 2000

[54] SEMICONDUCTOR MEMORY DEVICE CAPABLE OF PREVENTING NOISE FROM OCCURRING IN THE BUS LINES

[75] Inventor: Junichi Hayashi, Tokyo, Japan

[73] Assignee: NEC Corporation, Tokyo, Japan

[21] Appl. No.: 09/058,771

[22] Filed: Apr. 13, 1998

[30] Foreign Application Priority Data

Apr. 11, 1997 [JP] Japan ..................................... 9-110400

[51] Int. Cl.⁷ ..................................................... G11C 8/00
[52] U.S. Cl. ............................... 365/230.03; 365/185.13; 365/185.25; 365/149
[58] Field of Search .............................. 365/230.03, 190, 365/185.13, 185.11, 185.25, 149

[56] References Cited

U.S. PATENT DOCUMENTS

| | | | |
|---|---|---|---|
| 5,742,545 | 4/1998 | Kato | 365/190 |
| 5,757,707 | 5/1998 | Abe | 365/203 |
| 5,838,604 | 11/1998 | Tsuboi et al. | 365/63 |

*Primary Examiner*—David Nelms
*Assistant Examiner*—Tuan T. Nguyen
*Attorney, Agent, or Firm*—Sughrue, Mion, Zinn, Macpeak & Seas, PLLC

[57] ABSTRACT

In a semiconductor memory, in order to eliminate unbalance of the coupling capacitance between a bit line and a bus line so as to prevent noises from occurring, a layer of a column selection signal line is disposed in an intermediate layer position between a layer of the bit line and a layer of the bus line. Also, the width of the column selection line is increased to cover the bit lines whose width are different from each other due to a contact, to thereby shield the bit line and the bus line by the column selection signal line, and to balance of the coupling capacitance between the bit line and the bus line.

46 Claims, 6 Drawing Sheets

SEMICONDUCTOR MEMORY DEVICE CAPABLE OF PREVENTING NOISE FROM OCCURRING IN THE BUS LINES

BACKGROUND OF THE INVENTION

The present invention relates to a semiconductor memory device, and more particularly to a multi-bank memory structure.

There has been known a multi-bank memory structure in which a plurality of banks that operate independently are disposed within a chip, and those memories are interleaved. That is, the interleave system operates so that while a certain bank is accessed by latching a row address at a row address latch circuit relating thereto, another row address for a different bank is transmitted from a processor to a latch circuit relating thereto. The system can therefore sequentially access two banks without waiting for the completion of the access of a previous bank. Also, while a certain bank is being accessed, another bank can conduct pre-charging or refresh operation. Further, when an I/O bus line is commonly used between banks which are subjected to interleave operation to conduct pipe-line operation, data from different banks can be sequentially outputted.

At present, in order to realize high-speed operation of the semiconductor memory, such a multi-bank memory structure has been adopted.

Hereinafter, as the multi-bank memory structure, a two-bank structure including banks A and B as shown in FIG. 1 will be described. Referring to FIG. 1, the bank A comprises two plates P1 and P2 and each plates P1 and P2 comprise a plurality of memory cells in a matrix. For example, in the plate P1, there are a plurality of word lines connected to a row address decoder RD1, a plurality of column select lines 1 to 4 connected to a column address decoder CD1 and a plurality of pairs of bit lines D1 to D4, DB1 to DB4 as shown in FIG. 2. The bit lines D1 to D4 is complementary to the bit lines DB1 to DB4. For, example, when the bit line D1 is a high level (eg., logic 1), the bit line DB1 is a low level (eg., logic 0). Each memory cells is arranged at a position crossing a respective pair of bit lines and a respective word line. The bit lines D1 to D4 in the plate P1 are commonly connected to an I/O bus line T1 and the bit lines DB1 to DB4 are commonly connected to an I/O bus line N1. The bus line T1 is complimentary to the bus line N1. The structure of the plate 2 is the same to that of the plate 1. Pairs of bit lines in the plate P2 are connected to a pair of I/O bus lines T2 and N2 in common. On the other hand, the bank B has the same structure to the bank A. Pair of bit lines D10, DB10, D20, DB20 in a plate P3 are connected to a pair I/O bus line T1 and N1 in common. Pair of bit lines in a plate P4 are commonly connected to a pair I/O bus line T2 and N2. The I/O bus lines T1, N1, T2, N2 are connected to a write buffer (WBUF) and a data amplifier (DAMP) 109 to write or read data.

Next, the operation of this memory device will be explained. By responding to the respective word line, data stored at a memory cell (not shown) coupled to the bit lines D1 and DB1 in the bank A is transmitted to the bit lines D1 and DB1. Then, the column selection line 1 is activated (High level) to transfer data from the bit lines D1 and DB1 to the I/O bus lines T1 and N1, respectively, and the data are outputted to the data amplifier (DAMP) 109 through the bank B. In this situation, no data stored at a memory cell (not shown) coupled to the bit lines D10 and DB10 in the bank B is transmitted to the I/O bus lines T1 and N1. Conversely, when the data in the bank B is transmitted to the I/O bus lines T1 and N1 from the bit lines D10 and DB10, data in the bank A is not transmitted to the I/O buses T1 and N1.

FIG. 3A shows a layout around a connection portion between the bit lines D10, DB10 and the I/O bus lines T1, N1 in the plate P3. FIG. 3B shows a cross sectional view of the portion shown in FIG. 3A lined IIIA–IIIA'. Two I/O bus lines T1/N1 run in a parallel with each other and a vertical direction. The I/O bus line N1 is connected to a diffusion region K1 via contacts 208 and 209. The I/O bus line T1 is connected to a diffusion region K4 via conducts 211 and 212. Bit lines D10 and DB10 run in a parallel with each other in a horizontal direction. The bit line D10 has an extended portion under the I/O bus line T1 connected to a diffusion region K5 via contacts 216 and 217. The bit line DB10 has an extended portion under the I/O bus line N1 connected to a diffusion region k2 via contacts 213 and 214. A column selection line 206 runs in a horizontal direction between the bit lines D10 and DB10 at the top view. The column selection line 206 is connected to a tungsten layer 204 via a contact 215 and the tungsten layer 204 is coupled to a gate electrode 203 via a contact 210. The bit lines D10 and DB10 are formed from a silicide layer as a lower conductive layer. The I/O bus lines T1 and N1 and tungsten layer 204 are formed from a tungsten (W) layer as an intermediate conductive layer. The column section line 206 is formed from an aluminum layer as an upper conductive layer.

In this example, when a column selection signal is supplied with a selected column selection line 206, the signal is transmitted through the contact 215, the tungsten layer 204 and the contact 210 to the gate electrode 203. Upon that, the diffusion layers K1 and K2 are rendered conductive and the diffusion layers K4 and K5 are rendered conductive. As a result, data on the bit line D10 is outputted to I/O bus line T1 and data on the bit line DB10 is outputted to the I/O bus line N1.

In this situation, as shown in FIG. 4A, interlayer capacitance exist between adjacent layers, e.g. ,between the bit lines D10, DB10 and the I/O bus lines T1, N1. In details, as shown in FIG. 4A, there are a coupling capacitance C1 between the I/O bus line T1 and the bit line D10, a coupling capacitance C2 between the I/O bus line T1 and the bit line DB10, a coupling capacitance C3 between the I/O bus line N1 and the bit line D10, and a coupling capacitance C4 between the I/O bus line N1 and the bit line DB10. It is noted that the widths of the bit lines relating to the capacitance C1 and C4 is larger than that of the bit lines relating to the capacitance C2 and C3 because contacts are made on the capacitance C1 and C4 sides.

Then, for example, the column selection signal 1 in the bank A is activated in response to a column address strobe (CAS) signal so that data on the bit lines D1 and DB1 is transmitted to the I/O bus lines T1 and N1 and outputted to the data amplifier (DAMP) through the bank B. In this time, the bank B is accessed by a row address strobe (RAS) signal to pre-charge the bit lines D10 and DB10 to an intermediate potential VCC/2 from a supply potential VCC and ground potential GND respectively during the data outputing through the bank B.

Upon pre-charging the bit lines D10 and DB10, the voltage levels on the I/O bus lines T1 and N1 are influenced by coupling capacitors C1 to C4 based on the pre-charging of the bit lines D10 and DB10. Here, if the bit lines D10 and DB10 are equal in line width to each other and kept constant, one of those bit lines D10 and DB10 is pre-charged from VCC potential to VCC/2, and the other bit line is pre-charged from GND potential to VCC/2, as a result of which a change in interlayer capacitance is symmetrical, and the influence thereof is canceled. That is, C1−C2=0, and C3−C4=0 are satisfied. However, because the bit line D10 has the contacts 216 and 217 at a position below the I/O bus line T1 and the bit line DB10 has the contacts 213 and 214 at a position below the I/O bus line N1, the widths of the bit lines D10 and DB10 are not identical with each other, thereby, the coupling capacitance becomes C1>C2, and C4>C3. For that reason, a voltage change based on the difference of the capacities C1 to C4 becomes large at a side where the contact is provided, so that noise is produced at the I/O bus lines and adversely affects the data outputted from the bank A. When a capacitance of the entire I/O bus lines is $C_{IO}$, and a total difference in capacitance which is caused by unbalance in interlayer capacitance between the I/O bus line and the bit line is $C_{BIT}$, $C_{BIT}$ is then about 1% of $C_{IO}$ and the bit line is fluctuated 3.3V by pre-charging. As a result, a noises of about 33 mV occurs in the I/O bus line because the influence of that fluctuation, as shown in FIG. 4B. The noise produced on the I/O bus lines directly leads to the deterioration of operation margin such that a malfunction of the data amplifier (DAMP) occurs, thus preventing the semiconductor memory from functioning properly when being highly integrated.

On the other hand, Japanese Laid-Open Patent Application No. 62-60255 shows a semiconductor memory of one transistor type, having a word line, a bit line, and a column address line between the bit line and the word line so as to reduce the capacitance of the bit line and the word line. However, since No. 62-60255 only shows that the interlayer capacitance between the word line and bit line is merely reduced, there is no explanation about the unbalance of capacitance based on a difference in the size of the lines. Further, even though the noise on the bit line is reduce, when a noise on a bus line occurs, there is a problem that a voltage corresponding to data on the bus line varies because of the noise so that the DAMP 109 outputs a wrong data finally.

As described above, in the multi-bank structure semiconductor memory, in the case where the I/O bus lines are commonly used between the multi-banks to conduct pipeline operation, there is a case in which data output which is caused by a CAS signal for access to a certain bank overlaps with a pre-charge of the bit line which is caused by a RAS signal for access to a bank through which the data output passes. In this situation, in the case where the coupling capacitance of the bit line and the I/O bus line is unbalanced, noises occurs in the I/O bus line due to pre-charging of the bit line, thereby deteriorating the operation margin and causing inaccurate read operation.

SUMMARY OF THE INVENTION

It is therefore an object of the present invention to provide a semiconductor memory device which suppresses the unbalance in the interlayer capacitance between the bit line and the I/O bus line.

A semiconductor memory according to the present invention comprises a first bit line; a second bit line which is complementary to the first bit line; a first bus line; a second bus line which is complementary to the first bus lines; wherein a first capacitance between the first bus line and said first bit line and a second capacitance between said bus line and said second bit line are substantially the same, a third capacitance between the second bus line and the first bit line and a fourth capacitance between the second bus line and the second bit line are substantially the same.

The present invention is characterized in that a column selection signal is disposed between the first and second bus lines and the first and second bit lines.

Preferably, a layer of a column selection line is disposed at an intermediate layer position of the respective layers of the bit line and the bus line, and the line widths of the column selection signals on the bit lines and which are different in line with from each other are widened so that they cover at least a portion different in the line width of the bit line, or that they are larger than an interval between the bit lines, thereby shielding the bit lines and the bus line to suppress the unbalance of the coupling capacitance.

DETAILED DESCRIPTION OF THE PREFERRED EMBODIMENTS

Figure 5:
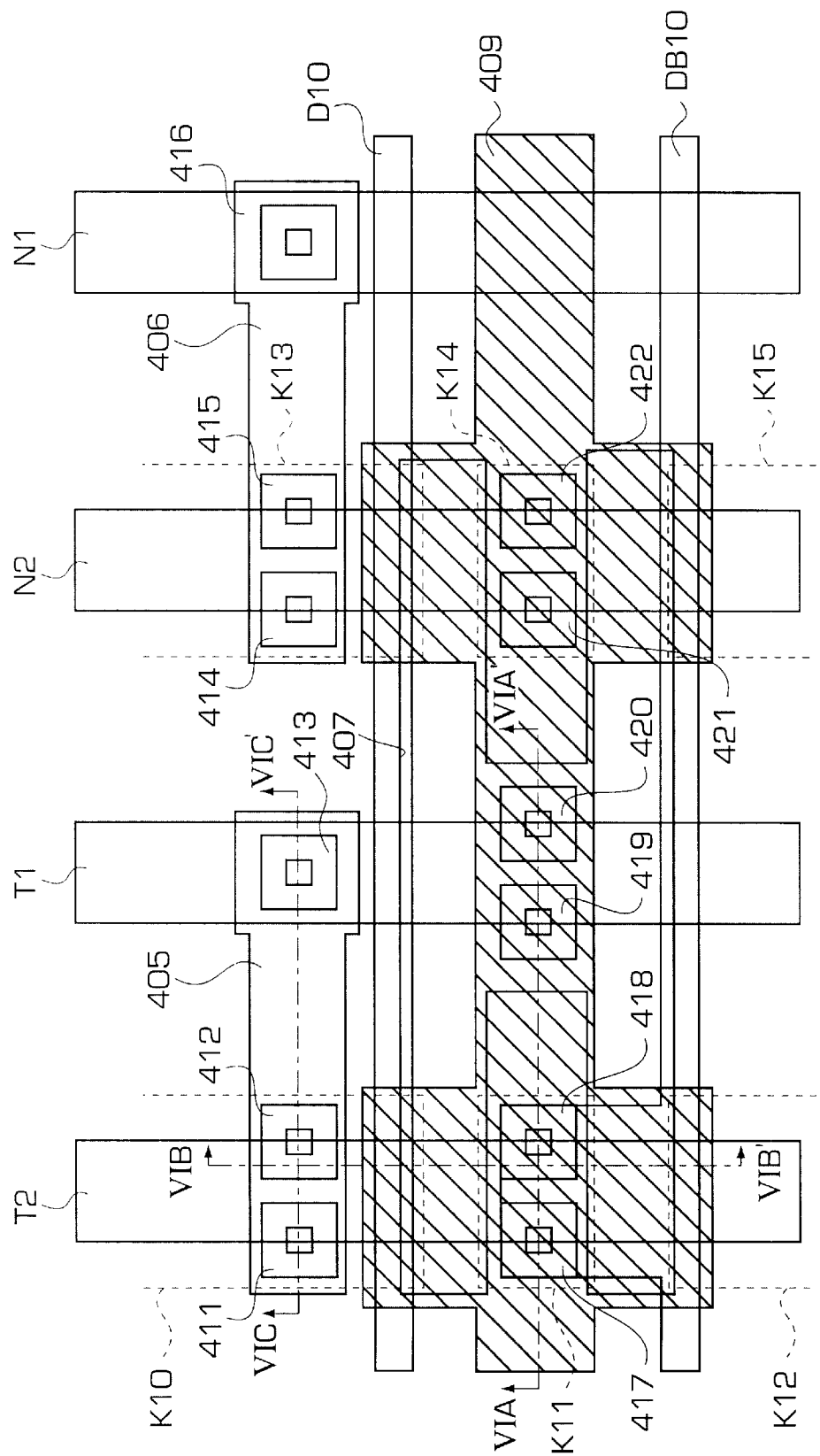
FIG. 5 is a plane view in part of the plate P3 in the bank B regarding the semiconductor memory device shown in FIG. 1 of an embodiment of the present invention.
Figure 6A:
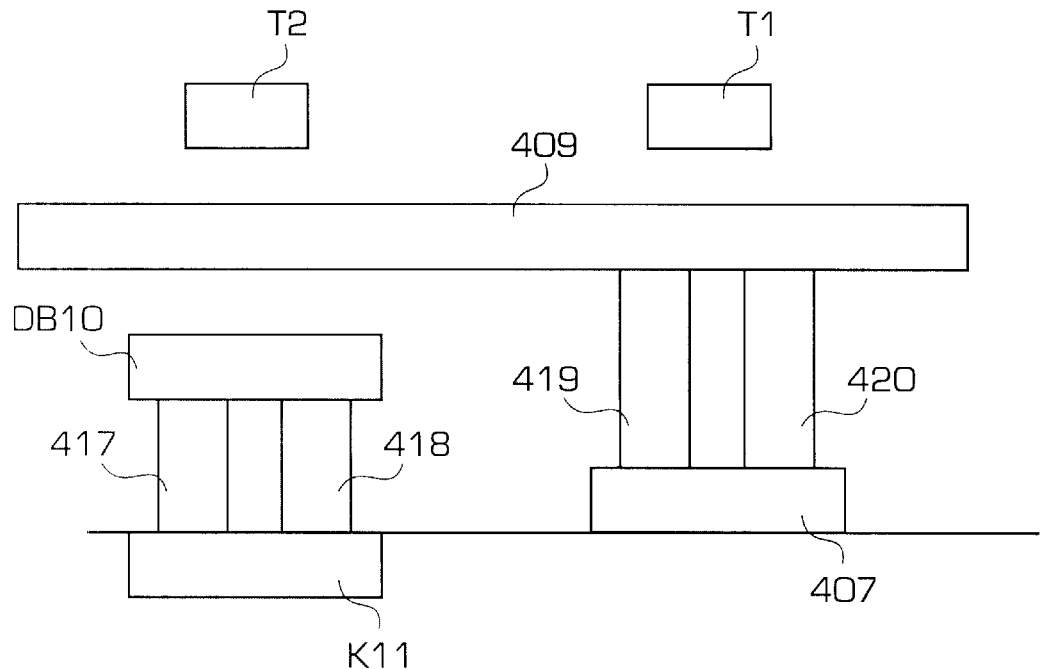
FIGS. 6A to 6C are cross sectional views of the semiconductor memory device shown in FIG. 5 lined at VIB–VIB', VIC–IVC', VID–VID', respectively.
Figure 6B:
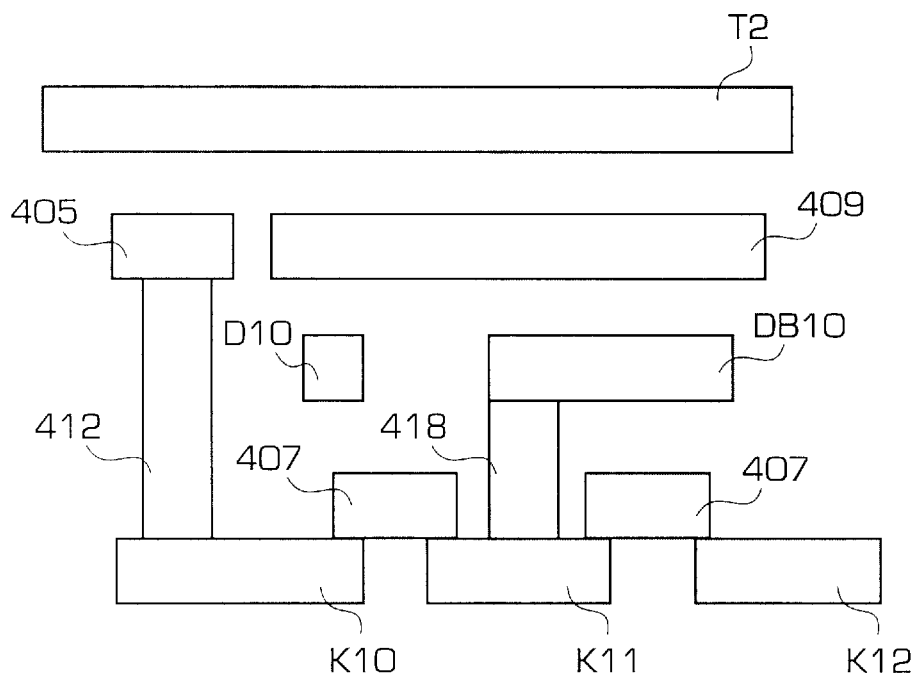
Figure 6C:
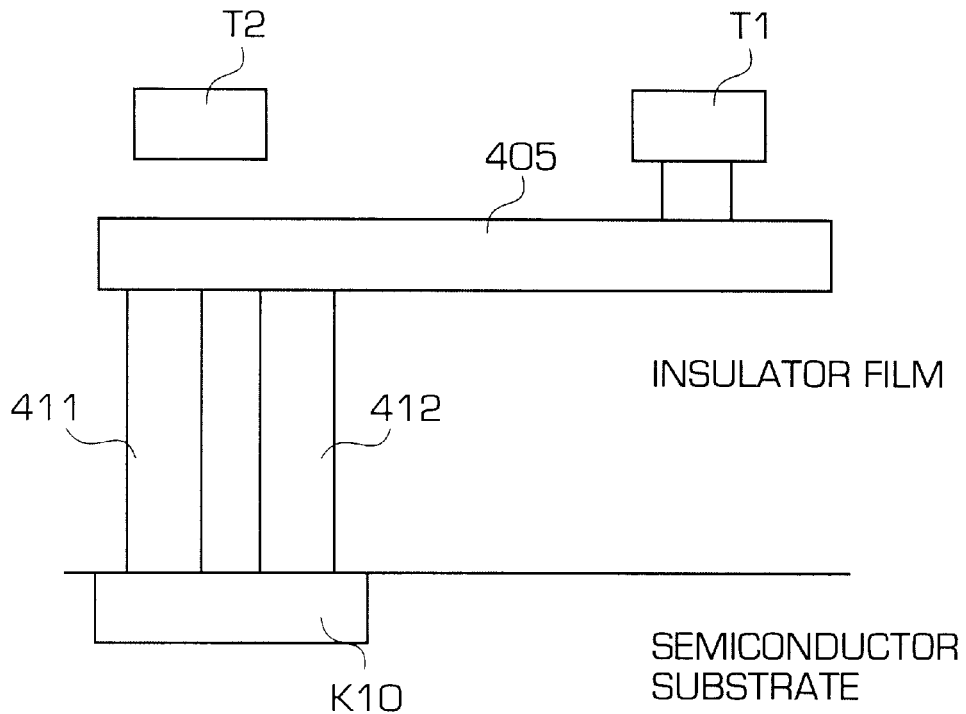

FIGS. 5 and 6A to 6C show an embodiment of the present invention. In detail, FIG. 5 illustrates a layout showing an embodiment of the present invention, FIG. 6A shows a cross sectional view of the portion shown lined VIA–VIA' in FIG. 5, FIG. 6B shows a cross sectional view of the portion shown lined VIB–VIB' in FIG. 5, and FIG. 6C shows a cross sectional view of the portion shown lined VIC–VIC' in FIG. 5.

In this embodiment, I/O bus lines T1, T2, N1, and N2 are made of an aluminum wiring layer as an upper conductive layer, and bit lines D10 and DB10 are made of a silicide layer as a lower layer, and a column selection signal line 409 and a tungsten layer 405 are made of a tungsten layer as an immediate layer.

In FIG. 5, two pairs of the I/O bus lines T1, N1 and the I/O bus lines T2, N2 are alternately disposed in parallel with each other in a vertical direction. The I/O bus lines T1, T2, N1, and N2 are made of aluminum wiring which is low resistance. A space is produced between the I/O bus lines T1 and N1 so that the I/O bus lines T2 and N2 (having no contact for connecting to the bit lines D10 and DB10) can be wired alternatively with the I/O bus lines T1 and N1. Data read out from a memory cell belonging to the bit lines D1, DB1 in the plate P1 and a memory cell belonging to the bit lines D30, DB30 in the plate P2 are transferred in the I/O bus lines T1 and N1, T2 and N2, respectively, at substantially the same time. Next, Data read out from a memory cell belonging to the bit lines D2, DB2 in the plate P1 and a memory cell belonging to the bit lines D31, DB31 in the plate P2 are transferred in the I/O bus lines T1 and N1, T2 and N2, respectively, at substantially the same time. In FIG. 5A, the I/O bus lines T2 and N2 exist outside of a pair of the I/O bus lines T1 and N1.

Regarding the I/O bus lines T1 and T2, the I/O bus line T1 is connected to the tungsten layer 405 via a contact 413. The tungsten layer 405 is extending in a horizontal direction and is connected to a diffusion region K10 via contacts 411 and 412 under the I/O bus line T2. The bit lines D10 and DB10 run in parallel with each other in a horizontal direction. The bit line DB10 has an extended portion connected to a diffusion region K11 via contacts 417 and 418 under the I/O bus line T2. The column selection line 409 runs between the bit lines D10 and DB10 in a horizontal direction as shown in the plane view of FIG. 5. The column selection line 409 is connected to a gate electrode 407 via contact 419 and 420. It is noted that a gate insulating film (not shown) is formed between the gate electrode and a semiconductor substrate and there are insulating films between the various conductive layers, such as bit lines D10, DB10. The column selection line 409 has an extending portion for at least covering an overlapping portion between the bit lines D10 and DB10 and the I/O bus lines T2 and N2. On the other hand, regarding the side of the I/O bus lines N1 and N2, the explanation is omitted except for noting that the bit line D10 has an extended portion connected to a diffusion region K14 via contacts 421 and 422, because the layout is substantially same to the side of the I/O bus lines T1 and T2.

These diffusion regions K10–K15 function as source/drain region of the respective transistor. That is, a first transistor consists of the diffusion regions K10 and K11 and the gate electrode 407, a second transistor consists of the diffusion regions K11 and K12 and the gate electrode 407, a third transistor consists of the diffusion regions K13 and K14 and the gate electrode 407, and a fourth transistor consists of the diffusion regions K14 and k15 and the gate electrode 407.

When the column selection line 409 is activated, the gate electrode 407 is activated via the contacts 419 and 420 so that data on the bit line D10 are transferred to the I/O bus line N1 through the contacts 421, 422, the diffusion regions K14, K13, the contacts 414 and 415, the tungsten layer 406, and the contact 416, in that order. Further, data on the bit line DB10 are transferred to the I/O bus line T1 through the contacts 417 and 418, the diffusion regions K11, K10, the contacts 411 and 412, the tungsten layer 405, and the contact 413 in the order.

It is assumed that data is transferred from the bit lines D30 and DB30 in the plate P2 of the bank A to the I/O buses T2 and N2 by accessing the bank A with a CAS signal and then the data is transferred to the WBUF/DAMP 109 via the bank B and, at that time, the bank B is accessed with a RAS signal, while the data outputed from the bank A is transferring in the bank B, so as to pre-charge the bit lines D10 and DB10 in the bank B. It is noted that the bit lines D30 and DB30 is accessed at the same time with the bit lines D1 and DB1 to output data to be outputed I/O bus lines T1, T2, N1, N2 at the same time.

Figure 7:
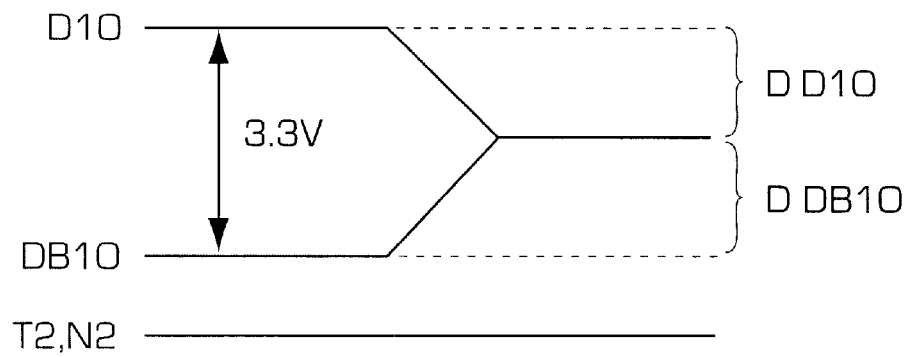
FIG. 7 are a diagram for explaining the effect of the present invention.

In this embodiment, the tungsten layer of the column selection signal line 409 is formed at an intermediate level and have extended portions, which extended at a distance to be between the I/O bus lines T2, N2 and the bit lines D10, DB10. Forming colum selection line at an intermediate level causes the distances between the bit lines D10, DB10 and the I/O bus lines T2, N2 to become great enough to reduce the interlayer capacitance therebetween. Also, the extended portions of the column selection line 409, at the time of pre-charging the bit lines D10 and DB10, when the column selection signal 409 does not operate, for example, is fixed at a ground potential, and acts as a shield between the bit lines D10, DB10 and the I/O bus lines T2, N2, to thereby reduce noise in the I/O bus lines T2 and N2 which might be caused by the bit lines D10 and DB10. Furthermore, at the portions of the column selection line 409 where the bit lines D10 and DB10 are different in wiring width from each other, the width of the column selection line 409 is set such that it covers at least the portion where the bit lines are different in line width. In other word, the width of the column selection line 409 is larger than a wiring interval between the bit lines, thereby preventing the unbalance of the interlayer capacitance between the bit lines D10, DB10 and the I/O bus lines T2, N2. That is, each of the capacitance C1 between the I/O bus line N2 and the bit line D10, the capacitance C2 between the I/O bus line N2 and the bit line DB10, the capacitance C3 between the I/O bus line T2 and the bit line D10, and the capacitance C4 between the I/O bus line T2 and the bit line DB10 are reduced or no exist. That is, the capacitive effect of the bit lines and the data bus lines is essentially eliminated, as shown in FIG. 7. Even though the capacitance C1–C4 exist, the capacitance C1 becomes substantially the same as the capacitance C2 and the capacitance C3 becomes substantially the same as the capacitance C4. Therefore, even if the bank B is accessed at an output timing of the I/O bus lines T2 and N2, noise can be prevented from occurring in the I/O buses T2 and N2 due to pre-charging of the bit lines D10 and DB10.

On the I/O bus lines N1 and T1, there are a fifth capacitance between the bit line D10 and the I/O bus line N1, a sixth capacitance between the bit line DB10 and the I/O bus line N1, a seventh capacitance between the bit line T1 and the I/O bus line D10, and a eighth capacitance between the bit line DB10 and the I/O bus line T1. However, these capacitance do not influence the data on the I/O bus lines T1 and N1. That is, as shown in FIG. 7, because each the capacitances has the same size, the voltage change on the I/O bus line N1, T1 due to the voltage change on the bit line D10, which are caused by the fifth and seventh capacitances, respectively, are canceled by the voltage change on the I/O bus line N1, T1 due to the voltage change on the bit line DB10, which are caused by the sixth and eighth capacitances, respectively. Therefore, the I/O bus line exporcerees little or no change in potential due to changes in the potential of the bit lines DB1 and DB10.

As was described above, according to the present invention, there is provided such a structure that the column selection line is extended to an intermediate position between a bit line and an I/O bus line so that the column selection line shields the bit line and the I/O line. Further, the line width of the column selection line is increased so that it covers a portion where the width of the bit line are different, to thereby balance of the interlayer capacitance between the bit line and the I/O bus line. As a result, the present invention is advantageous in that noise in the I/O bus line is reduced to prevent the operation margin from being deteriorated.

Figure 1:
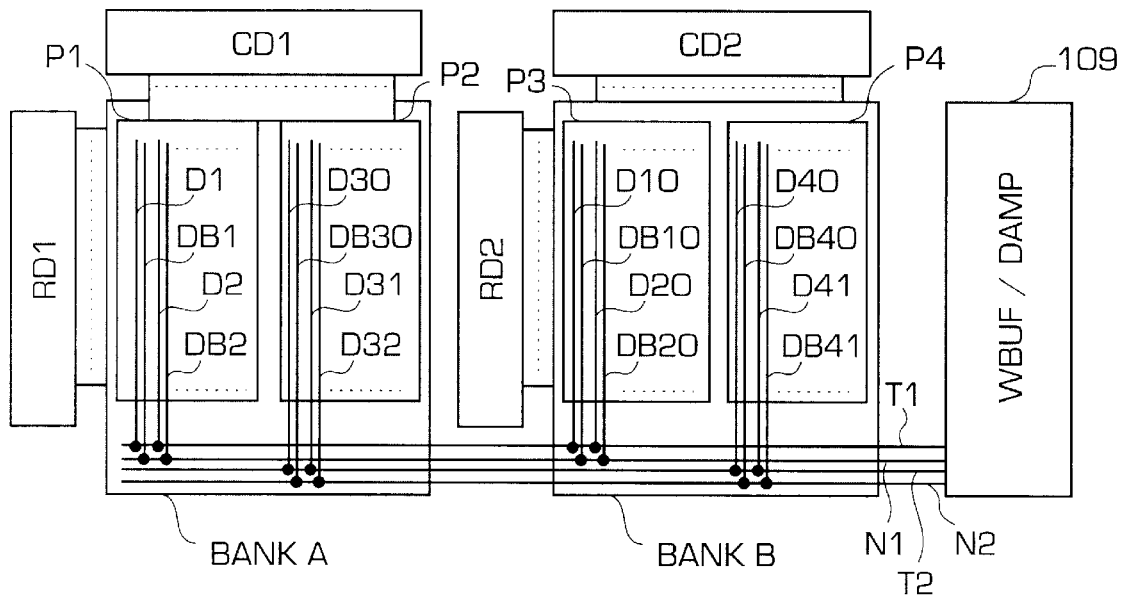
FIG. 1 is a structural diagram of a semiconductor memory device including multiple banks that conduct pipeline operation of the prior art.
Figure 2:
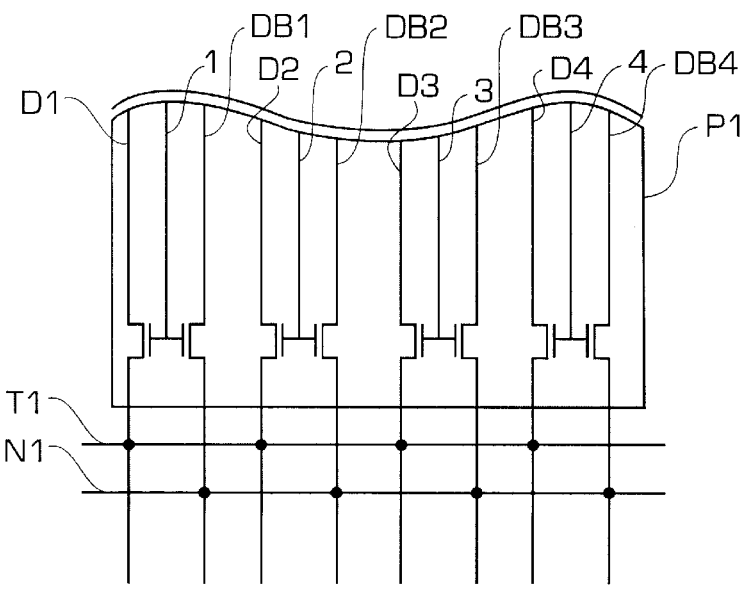
FIG. 2 is a structural diagram showing a part of the plate P1 in the bank A regarding the semiconductor memory device as shown in FIG. 1.
Figure 3A:
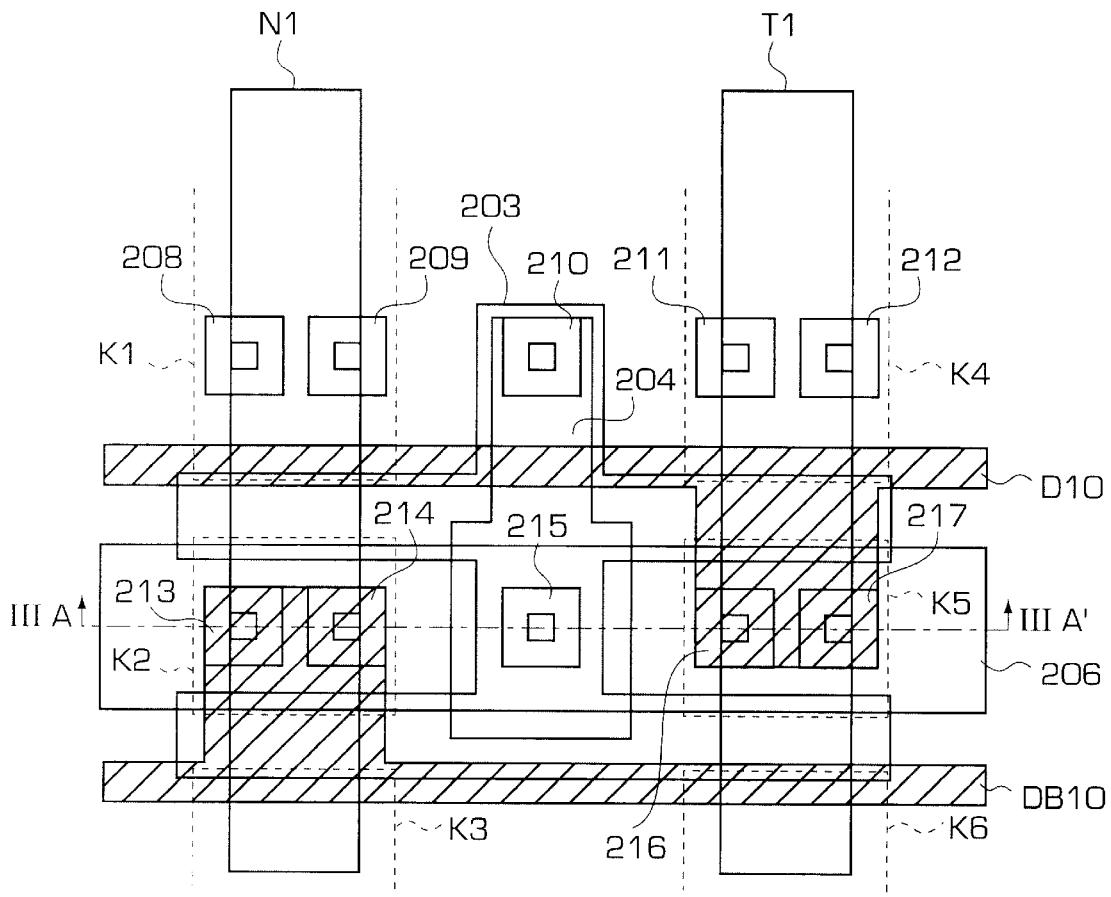
FIG. 3A is a plane view in part of the plate P3 in the bank B regarding the semiconductor memory device as shown in FIG. 1.
Figure 3B:
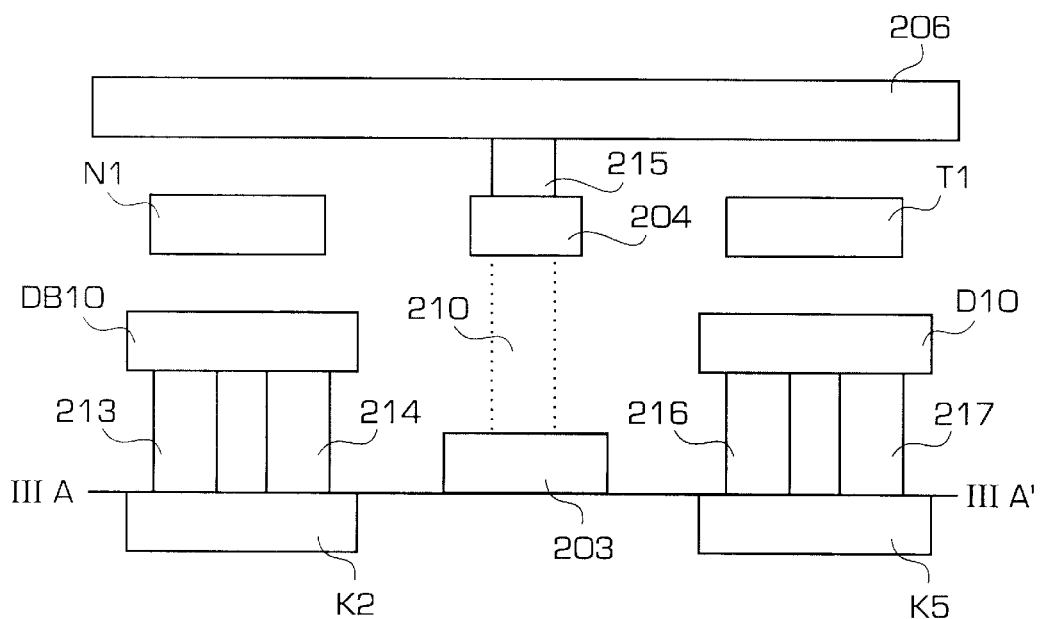
FIG. 3B is a cross sectional view of the semiconductor memory device shown in FIG. 3B lined at IIIA–IIIA'.
Figure 4A:
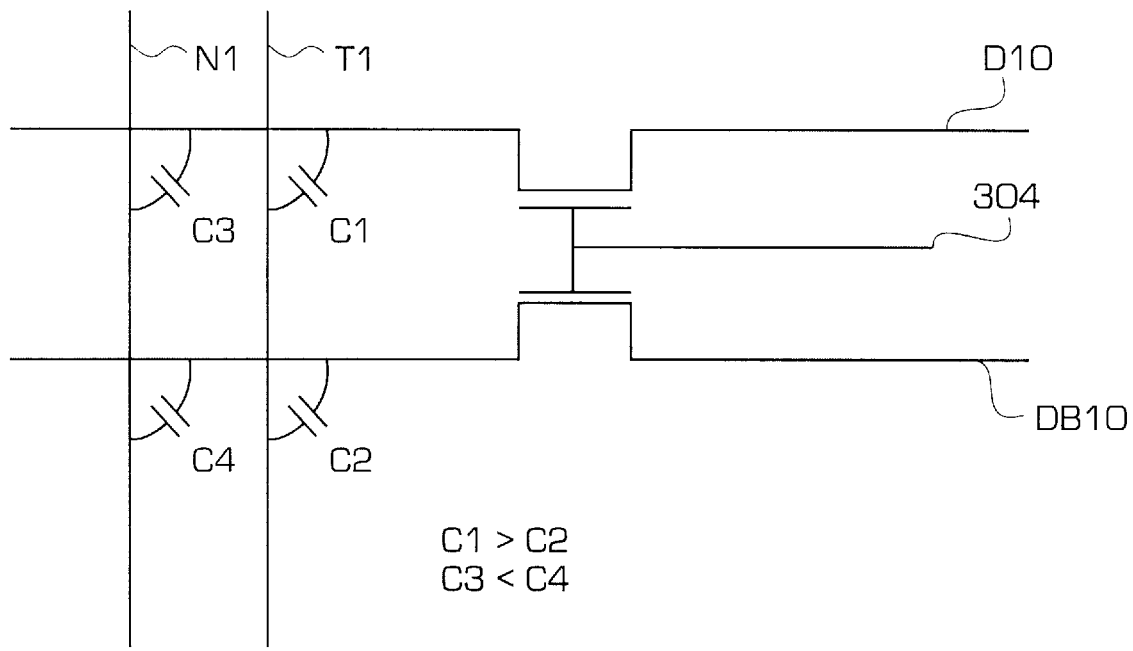
FIGS. 4A and 4B are diagrams for explanation of a joint (parasitic) capacitance between a bit line and an I/O bus line and the occurrence of noises due to pre-charging of a bit line for the semiconductor memory device of the prior art.
Figure 4B:
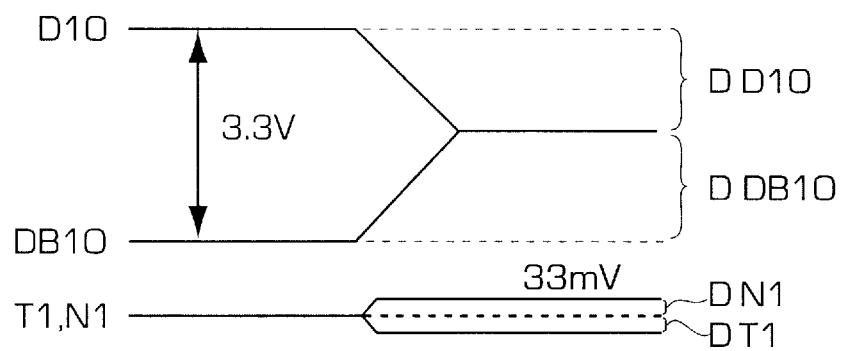

It is apparent from the embodiment that the present invention is not limited to the above embodiment but may be modified and changed without departing from the scope and spirit of the invention. For example, in FIG. 1, three banks or more may be connected to the I/O bus lines in common. The number of the I/O bus lines is not limited to two pair, but can be at least one pair of the bit lines T2 and N2. There may be at least one plate in each bank. Though each banks has one row address decoder and one column address decoder, the number of address decoders is not so limited. For example, one column address decoder may belong to a plurality of banks. Though two plates in the bank A are arranged in a horizontal direction in FIG. 1, they may be arranged in a vertical direction. Though I/O bus lines are used in this embodiment of the present invention, they may merely be input bus lines or output bus lines. For example, when bus lines connected to the banks A and B in common are input bus lines, data are transferred from the buffer 109 to the bank A through the output bus lines and the bit lines in the bank B are, for example, pre-charged at that time. It is clear from the description of the embodiment of the present invention that the bus lines connected to the banks A and B in common may be output bus lines. It is not limited that the arrangement in order of the bus lines N1, N2, T1, T2 as shown in FIG. 5. For example, they may be arranged with every pair of bus lines (e.,g N1, T1) as the bus lines arranged in the order N1, T1, N2, T2. Moreover, the number of contacts is not limited to those shown in the embodiment of the present invention.

What is claimed is:

1. A semiconductor memory device comprising:
   a first bank including a first bit line;
   a second bank including a second bit line;
   a first bus line commonly formed in said first and second banks; and
   means for preventing voltage potential corresponding to data from said first bit line from varying with influence of the variation of voltage potential of said second bit line, when data is output from said first bank and transfers from said first bit line to said first bus line and said second bank is accessed and voltage potential of said second bit line in said second bank varies at substantially the same time.

2. The device as claimed in claim 1, wherein said means is a layer for shielding between said second bit line and said bus line.

3. The device as claimed in claim 2, wherein said layer is located between said second bit line and said bus line.

4. The device as claimed in claim 3, wherein said bus line is an output bus line.

5. The device as claimed in claim 4, wherein said layer is a column selection line.

6. The device as claimed in claim 5, wherein said second bit line is made by a first level layer, said bus line is made by a second level layer, and said column selection line is made by a third level layer different from said second bit line and said bus line.

7. The device as claimed in claim 2, further comprising a third bit line in said second bank, said third bit line is complimentary to said second bit line and a voltage potential of said third bit line varies at a same time when said voltage potential of said second bit line varies.

8. The device as claimed in claim 6, wherein said second bit line comprises an extended portion overlapping said bus line.

9. The device as claimed in claim 8, wherein, when the variation of said voltage potential of said second bit line is caused by pre-charged.

10. A semiconductor memory device including a first bank and a second bank, comprising:

a first bit line in said second bank;
   a second bit line in said second bank, said second bit line being complementary to said first bit line;
   a bus line in said second bank formed such that data outputed from said first bank pass through said second bank; and
   a layer for substantially equalizing a first capacitance between said first bit line and said bus line with a second capacitance between said second bit line and said bus line.

11. The device as claimed in claim 10, wherein said layer is a column selection line.

12. The device as claimed in claim 11, wherein said column selection line is made from a silicide layer.

13. The device as claimed in claim 10, wherein said first bit line has an extended portion overlapped with said bus line where a contact is formed, and said layer for equalizing overlaps with said extended portion.

14. The device as claimed in claim 13, wherein said first and second bit lines are pre-charged when data is transferred in said bus line.

15. The device as claimed in claim 11, wherein said bus line is an output bus line.

16. A semiconductor memory device comprising;
    a first bus line in a first direction;
    a first bit line in a second direction perpendicular to said first direction, said first bit line crossing with said first bus line;
    a second bit line in said second direction, said second bit line crossing with said first bus line and having an extended portion to be connected to a contact, said extended portion overlapping with said first bus line; and
    a shield layer in said second direction, said shield layer having a first extending portion formed between said extended portion of said second bit line and said bus line.

17. The device as claimed in claim 16, wherein said shield layer further has a second extending portion between said first bit line and said bus line and a third extending portion between said second bit line and said bus line.

18. The device as claimed in claim 17, wherein said first and second bit lines are a first level layer, said bus line is a second level layer, and said shield layer is a third level layer between said first level layer and said second level layer.

19. The device as claimed in claim 18, wherein said layer is a column selection line.

20. The device as claimed in claim 19, wherein said column selection line is made from a silicide layer.

21. The device as claimed in claim 20, wherein said first and second bit lines are pre-charged when data are transferred in said bus lines.

22. The device as claimed in claim 16, wherein said bus line is an output bus line.

23. A semiconductor memory device comprising;
    a first bus line in a first direction;
    a second bus line in said first direction, said second bus line being complementary to said first bus line;
    a first bit line in a second direction perpendicular to said first direction, said first bit line crossing with said first and second bus lines and having a first extended portion to be connected with a first contact, said first extended portion overlapping with said first bus line;
    a second bit line in said second direction, said second bit line crossing with said first and second bus lines and having a second extended portion to be connected with a second contact, said second extended portion overlapping with said second bus line; and a shield layer in said second direction, said shield layer having a first extending portion formed between said first extended portion of said first bit line and said first bus line and having a second extending portion formed between said second extended portion of said second bit line and said second bus line.

24. The device as claimed in claim 23, wherein said first extending portion overlaps with said first extended portion overlapping said first bus line and said first bit line, said second extending portion overlaps with said second extended portion overlapping said second bus line and said second bit line.

25. The device as claimed in claim 24, wherein said shield layer further has a third extending portion overlapping with a portion which overlaps said second bit line with said first bus line, and a fourth extending portion overlapping with a portion which overlaps said first bit line with said second bus line.

26. The device as claimed in claim 25, wherein said first and second bit lines are a first level layer, said first and second bus lines are a second level layer, and said shield layer is a third level layer between said first and second level layers.

27. The device as claimed in claim 26, wherein said layer is a column selection line.

28. The device as claimed in claim 27, wherein said column selection line is made from a silicide layer.

29. The device as claimed in claim 23, wherein said first and second bit lines are pre-charged when data are transferred in said bus lines.

30. The device as claimed in claim 23, wherein said bus line is an output bus line.

31. A semiconductor memory device comprising;

a first bus line in a first direction formed by a first level layer;

a second bus line complimentary to said first bus line in said first direction formed by said first level layer;

a third bus line in said first direction formed by said first level layer;

a fourth bus line complimentary to said third bus line in said first direction formed by said first level layer;

a first bit line in a second direction perpendicular to said first direction formed by a second level layer, said first bit line crossing with at least one of said first through fourth bus lines, said first bit line having a first extending part overlapping said third bus line to form a first contact therethrough;

a second bit line in said second direction formed by said second level layer, said second bit line crossing with at least one of said first through fourth bus lines, said second bit line having a second extending part overlapping said fourth bus line to form a second contact therethrough; and a column selection line in said second direction between said first and second bit lines formed by an intermediate level layer between said first and second level layers, said column selection line having a first extended portion formed to overlap a portion overlapping said first bit line and said third bus line and to overlap said first extending part, a second extended portion formed to overlap a portion overlapping said first bit line and said fourth bus line, a third extended portion formed to overlap a portion overlapping said second bit line and said second bus line, and a fourth extended portion formed to overlap a portion overlapping said second bit line and said fourth bus line and to overlap said second extending part.

32. The device as claimed in claim 31, wherein a first connecting layer further is formed in said second direction formed by said third level layer, said first connecting layer has a first end in which is formed a third contact connected to said first bus line and a second end in which is formed a fourth contact electrically connected to said first contact when said column selection layer is activated.

33. The device as claimed in claim 32, wherein a second connecting layer further is formed in said second direction formed by said third level layer, said second connecting layer has a first end in which is formed a fifth contact connected to said second bus line and a second end in which is formed a sixth contact electrically connected to said second contact when said column selection layer is activated.

34. The device as claimed in claim 33, wherein said fourth and sixth contacts overlap with said third and fourth bus lines respectively.

35. The device as claimed in claim 34, wherein said second level layer is formed from a tungsten layer.

36. The device as claimed in claim 35, wherein said first level layer is formed from an aluminum layer.

37. The device as claimed in claim 31, wherein said third level layer is formed from a silicide layer.

38. The device as claimed in claim 31, wherein said first and second bit lines are pre-charged when data are transferred in said second and fourth bus lines.

39. The device as claimed in claim 31, wherein said first through fourth bus lines are output bus lines.

40. A semiconductor memory device comprising;

a first pair of data bus lines;

a second pair of data bus lines;

a first bank having a first plate which includes a plurality of first pairs of bit lines each connected to said first pair of data bus lines in common, and having a second plate which includes a plurality of second pairs of bit lines each connected to said second pair of data bus lines in common;

a second bank having a first plate which includes a plurality of first pairs of bit lines each connected to said first pair of data bus lines in common, and having a second plate which includes a plurality of second pairs of bit lines each connected to said second pair of data bus lines in common, said first pairs of bit lines being overlapped with said second pair of data bus lines, said second pairs of bit lines being overlapped with said first pair of data bus lines; and a layer for preventing voltage potential corresponding to data from varying with influence of the variation of voltage potential of said first second pair of bit lines in said first plate of said second bank when said data transfers on said pair of data bus lines and voltage potential of at least one of said plurality of said first pair of bit lines in said first plate of said second bank varies.

41. The device as claimed in claim 40, wherein said bit lines are made by a first level layer, said data bus lines are made by a second level layer, and said layer is made by a third level layer placed in between said first level layer and said second level layer.

42. The device as claimed in claim 41, wherein said layer is a column selection line.

43. A semiconductor memory device, comprising:
a shield layer interposed between a plurality of bit lines and a data bus line in a contact area so as to reduce and equalize coupling capacitance between a first one of said plurality of bit lines and said data bus line and a second one of said bit lines and said data bus line.

44. The device as claimed in claim 43, wherein said shield layer is a column selection line.

45. The device as claimed in claim 44, wherein said first and second of said plurality of bit lines are pre-charged when data is transferred in said data bus line.

46. The device as claimed in claim 44, wherein said first one of said plurality of bit lines is complimentary to said second one of said plurality of bit lines.

* * * * *

UNITED STATES PATENT AND TRADEMARK OFFICE
CERTIFICATE OF CORRECTION

PATENT NO.: 6,088,283
DATED: July 4, 2000
INVENTOR(S): Junichi HAYASHI

It is certified that error(s) appears in the above-identified patent and that said Letters Patent is hereby corrected as shown below:

Column 5, line 42, delete "k15" insert K1S--.

Column 6, line 2, delete "colum" insert --column--.

Column 10, line 56, delete "second".

line 58, after "said" insert --second--.

Signed and Sealed this

Twenty-fourth Day of April, 2001

Attest:

NICHOLAS P. GODICI

Attesting Officer

Acting Director of the United States Patent and Trademark Office

UNITED STATES PATENT AND TRADEMARK OFFICE
CERTIFICATE OF CORRECTION

PATENT NO.     : 6,088,283
DATED          : July 4, 2000
INVENTOR(S)    : Junichi Hayashi It is certified that error appears in the above-identified patent and that said Letters Patent is hereby corrected as shown below:

Column 5,
Line 42, delete "k15" insert -- K15 --.

Signed and Sealed this

Eleventh Day of September, 2001

Attest:

*Attesting Officer*

NICHOLAS P. GODICI
*Acting Director of the United States Patent and Trademark Office*